United States Patent [19]

Corman et al.

[11] 3,852,806

[45] Dec. 3, 1974

[54] NONWICKED HEAT-PIPE COOLED POWER SEMICONDUCTOR DEVICE ASSEMBLY HAVING ENHANCED EVAPORATED SURFACE HEAT PIPES

[75] Inventors: James C. Corman; Michael H. McLaughlin, both of Scotia; Gunnar E. Walmet, Schenectady, all of N.Y.

[73] Assignee: General Electric Company, Schenectady, N.Y.

[22] Filed: May 2, 1973

[21] Appl. No.: 356,566

[52] U.S. Cl. ...................... 357/82, 165/80, 165/105, 174/15, 357/79

[51] Int. Cl. ............................ H01l 3/00, H01l 5/00

[58] Field of Search .................... 317/234, 1, 1.5, 6; 174/15; 165/80, 105

[56] References Cited

UNITED STATES PATENTS

| | | | |
|---|---|---|---|
| 3,736,474 | 5/1973 | Sias | 317/234 P |
| 3,739,234 | 6/1973 | Bylund et al. | 317/234 B |
| 3,739,235 | 6/1973 | Kessler | 317/234 B |
| 3,746,947 | 7/1973 | Yamamoto | 317/234 A |

*Primary Examiner*—Andrew J. James
*Attorney, Agent, or Firm*—Louis A. Moucha; Joseph T. Cohen; Jerome C. Squillaro

[57] ABSTRACT

At least one of the two pressure plates used for mounting a replaceable power semiconductor device with pressure interfaces is utilized with an evaporating surface enhancement means as an evaporating surface in a nonwicked gravity-return heat pipe. This location of the evaporating surface in close proximity to the heat-emitting power semiconductor device decreases the steady-state thermal resistance as well as decreasing the transient temperature rise for long term heat overloads to produce improved vaporization cooling of the device.

12 Claims, 3 Drawing Figures

Figure 3:
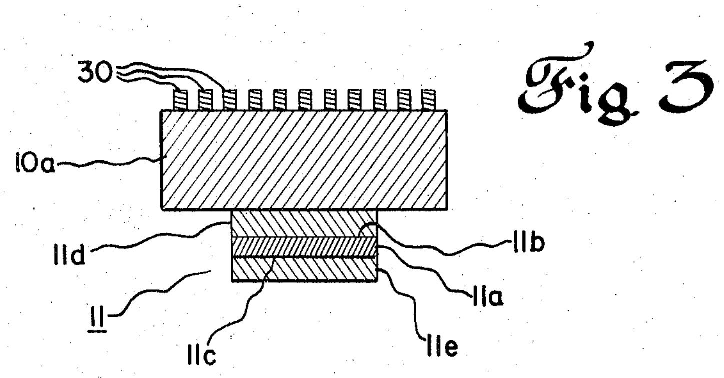

NONWICKED HEAT-PIPE COOLED POWER SEMICONDUCTOR DEVICE ASSEMBLY HAVING ENHANCED EVAPORATED SURFACE HEAT PIPES

Our invention relates to a mounting assembly for a power semiconductor device which is used in conjunction with heat pipe cooling, and in particular, to an assembly which permits easy removal of the device and decreases the steady-state thermal resistance as well as decreasing the transient temperature rise to produce improved vaporization cooling of the device.

Semiconductor devices of various types are constantly being fabricated in larger sizes for power applications as distinguished from signal applications. The larger size of the device and higher current and power rating thereof requires an efficient means for removal of the heat generated within the device to maintain operation thereof within its rated steady-state and transient temperature limits. Since the future trend undoubtedly will be to increase the power rating of semiconductor devices even beyond those presently utilized, it is readily apparent that more efficient cooling means must be provided for such power devices.

Conventional cooling systems for power semiconductor devices are generally in the form of a finned heat sink which uses conduction heat transfer within the body of the heat sink as the means for transferring heat from the semiconductor device. An inherent limitation on the conventional finned heat sink performance results from the inefficiency in conduction heat transfer as the heat-transfer length (length of finned section and fin height) is increased. The semiconductor device-to-ambient thermal resistance possesses a conduction limit such that with a fixed cooling air flow velocity, adding more finned surface area by increasing the finned length or increasing the fin height, or with a fixed geometry, increasing the cooling air flow velocity, does not further decrease the thermal resistance.

Thus, one of the principal objects of our invention is to provide an improved cooling system for power semiconductor devices which is superior to the conventional finned heat sink system.

Another object of our invention is to provide the improved cooling system with superior steady-state and transient characteristics as compared to the conventional finned heat sink system.

Heat pipes are known devices for effecting heat transfer by vaporization of a liquid phase of a two-phase fluid coolant contained within a sealed chamber or pipe, by the application of heat to a vaporization, or evaporator, section of the chamber. The vaporization section of the heat pipe thus receives heat from the device being cooled and the heated vapor, being under a relatively higher vapor pressure, moves to the lower pressure area in the condensation section of the chamber, or pipe by a substantially isothermal process wherein the vapor condenses and the condensate returns to the evaporator section to be vaporized again and, thus, repeat the heat transfer cycle. The condenser section of the heat pipe is, in effect, an air-cooled surface condenser functioning to reject heat to ambient air. A wick material disposed along substantially the entire inner surface of the heat pipe is conventionally used to pump the condensate to the vaporization evaporator section of the heat pipe by capillary action. Since the heat pipe does not utilize conduction as the heat transfer process (except for transferring the heat into and out of the heat pipe), and thereby overcomes the limitations inherent with the conventional finned heat sink due to its reduced efficiency of conduction heat transfer with increased path length, this suggests that the heat pipe may be a superior type device for use in cooling power semiconductor devices.

Therefore, another object of our invention is to provide an improved power semiconductor device assembly which uses heat-pipe cooling.

A further object of our invention is to provide an improved heat-pipe cooled power semiconductor device assembly wherein the power semiconductor device is a readily replaceable unit.

The use of heat pipes for cooling power semiconductor devices has recently become known. The first use of heat-pipe cooling of power semiconductor devices known to us is by Heat-Pipe Corporation of America of Westfield, New Jersey whose sales brochure generally describes heat pipes as being used to transport heat from electric motors, semiconductors, brakes and clutches and other heat producing devices. A publication prepared by the RCA Corporation at Lancaster, Pa. as a final technical report under contract DAAK0269-C-0609 dated October 1972 discloses heat-pipe cooled semiconductor thyristor devices. This assembly, however does not have our assembly's capability for removal of the semiconductor device, that is, if the semiconductor device must be replaced, the heat pipe is also lost since the wick is integral therewith. The use of a wicked heat pipe in the RCA assembly introduces high thermal losses and the wick pumping losses increase with length thereby limiting the length of heat pipe that may be effectively used. Our invention uses a nonwicked heat pipe. Finally, the RCA assembly has the wick in direct contact with the semiconductor device which does not permit any significant heat storage during heat transients. Thus, during a heat transient the RCA assembly would not appear to be able to reduce the resulting temperature rise due to the wick temperature rising at almost the same rate as the heat transient, and probably resulting in the wick material drying out. Our assembly uses a pressure plate as an interface between the semiconductor device and evaporator section of the heat pipe to obtain heat storage during transients. Finally, heat-pipe cooling of power semiconductor devices is also disclosed in a paper entitled APPLICATION OF HEAT PIPES TO THE COOLING OF POWER SEMICONDUCTORS by Edward J. Krolic-zek of the Dynatherm Corporation of Cockeysville, Md. which describes the mounting of a power semiconductor device to a heat pipe which is distinguished from our invention in that a wicked heat pipe is utilized in the Dynatherm assembly. Also, the Dynatherm assembly uses two heat pipes for single-sided cooling, each being of small size in cross-section and of flat configuration which also significantly increases the thermal resistance. The orientation of the small heat pipes relative to the large cooling fins in the Dynatherm assembly also results in poor heat distribution since conduction heat transfer is required in transferring the heat laterally from the edges of the heat pipes to the outer portions of the fins.

Therefore, another object of our invention is to provide an improved heat-pipe cooled power semiconductor device assembly which uses a nonwicked heat pipe.

A further object of our invention is to provide an improved heat-pipe cooled power semiconductor device assembly which has reduced thermal resistance and provides more efficient cooling capabilities.

Briefly summarized, and in accordance with the objects of our invention, we provide a heat-pipe cooled power semiconductor device assembly wherein two pressure plates are mounted on opposite sides of the device and bolted together to form heat storage and pressure interfaces therewith. The power semiconductor device can be single-sided cooled in which case only one of the pressure plates functions as the base and evaporating surface of a nonwicked heat pipe of the gravity-return type. In the case of double-sided cooling of the device, the second pressure plate is also utilized as the base and evaporating surface of a second nonwicked gravity-return heat pipe. The heat transfer capability of the pressure plate evaporating surface is enhanced by sintering a porous metallic material to the inner surface thereof or forming thereon a small fin surface as two examples. The electrical conductors which supply power to the power semiconductor device may conveniently be attached to the pressure plates which are clamped together by nut-bolt assemblies to obtain sufficient pressure against the power semiconductor device for obtaining good thermal and electrical contact therewith. The power semiconductor device is readily replaceable by removal of the pressure plate clamping bolts. This location of the evaporating surface of the heat pipe in relatively close proximity to the heat-emitting power semiconductor device decreases the steady-state thermal resistance as well as decreasing the transient temperature rise for long term heat overloads to thereby produced improved vaporization cooling of the device. In the case wherein the semiconductor material in the power semiconductor device is not passivated, a suitable hermetic seal is provided around such semiconductor device.

Figures 1, 2:
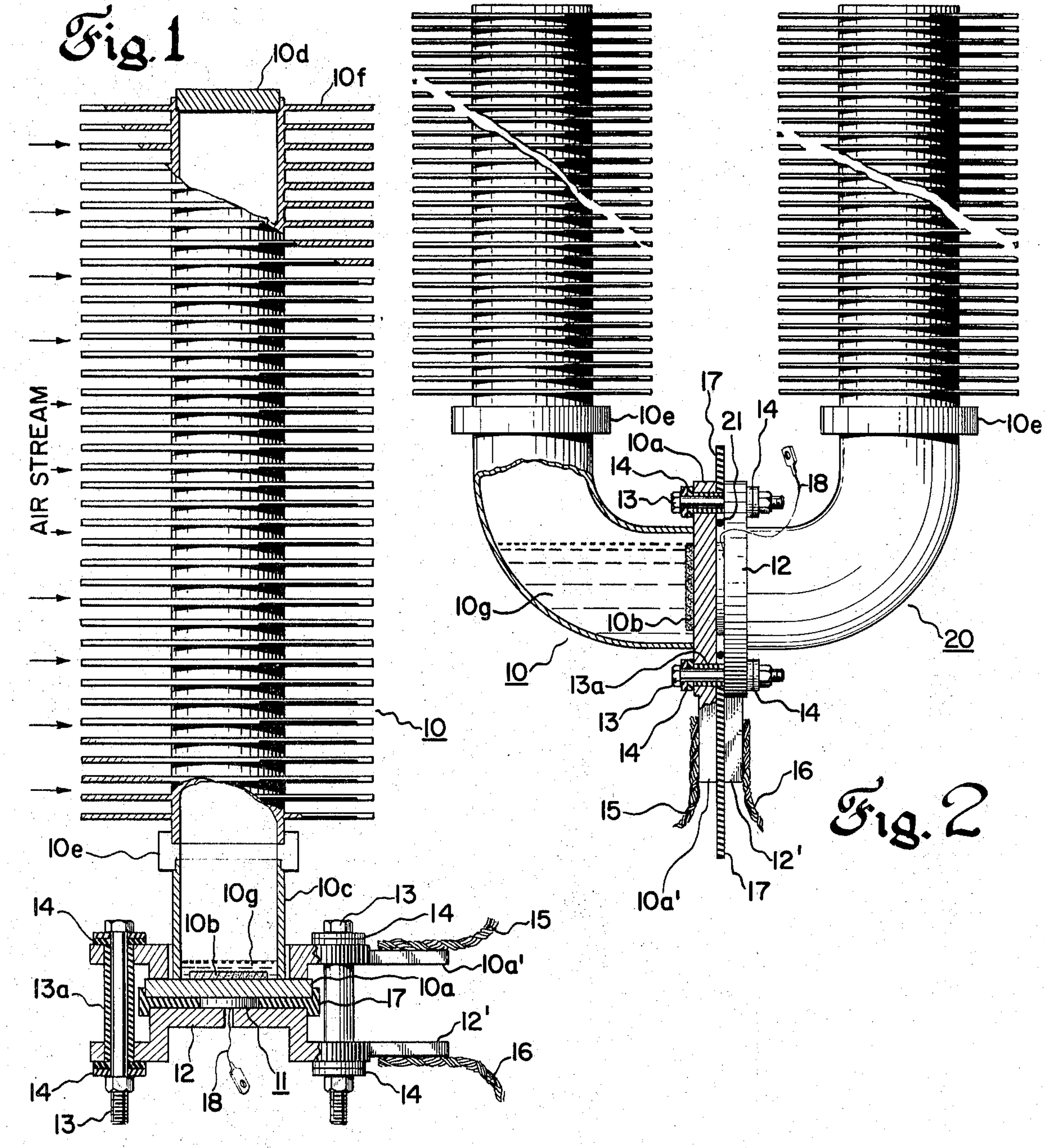

The features of our invention which we desire to protect herein are pointed out with particularity in the appended claims. The invention itself, however, both as to its organization and method of operation, together with further objects and advantages thereof may best be understood by reference to the following description taken in connection with the accompanying drawings wherein like parts in each of the several figures are identified by the same reference character, and wherein:

FIG. 1 is an elevation view, partly in section, of a single-sided heat-pipe cooled power semiconductor device assembly in accordance with our invention;

FIG. 2 is an elevation view, partly in section, of a double-sided heat-pipe cooled power semiconductor device assembly in accordance with our invention; and FIG. 3 is a fragmentary view of the power semiconductor device and one of the pressure plates having the evaporating surface thereof including a small finned assembly for increasing the maximum rate of heat transfer from the semiconductor device to the heat pipe.

Referring now in particular to FIG. 1, there is shown a first embodiment of our invention wherein a single nonwicked heat pipe of the gravity-return type and designated as a whole by numeral 10 is used for obtaining single-sided cooling of a power semiconductor device shown as a whole by numeral 11. The details of the power semiconductor device 11 are illustrated in FIG. 3 which depicts the device as a layered body including a body of semiconductor material 11*a* having first and second flat parallel major surfaces 11*b* and 11*c*, respectively, which define the body of semiconductor material therebetween. The fragile silicon junctions are protected against thermal and mechanical stresses by having the first major surface thereof 11*b* brazed or otherwise bonded to a substantial support plate 11*d* fabricated of tungsten or molybdenum as two typical metals. The second major surface 11*c* of the semiconductor body is not bonded to support plate 11*e* but is merely maintained in pressure contact therewith to prevent cracking or other damage to the semiconductor body which could result from thermal expansion stresses caused by the excursion in junction temperature during transient operation which may be in the order of 200°C. The material of support plates 11*d* and 11*e* must have good electrical and thermal conductivity, be of high strength and have a coefficient of thermal expansion substantially equal to that of the semiconductor material. The semiconductor body is always bonded to the particular support plate which is on the side to which the heat pipe is connected in the case of single-sided cooled devices.

The power semiconductor device is defined herein as being a device which develops a thermal density of at least 100 watts per square inch along the surfaces thereof. The power semiconductor device is retained between a pair of pressure plates 10*a* and 12 which are clamped together for exerting a pressure in the order of approximately 2,000 lbs. per square inch uniformly against the power semiconductor device. A pressure of this magnitude provides pressure interfaces between pressure plate 10*a* and support plate 11*d*, between the body of semiconductor material 11*a* and support plate 11*c* and between support plate 11*c* and pressure plate 12 which are of good thermal and electrical quality, that is, the smooth flat surfaces are uniformly in sufficient pressure contact to have negligible voids therebetween and thereby reduce the thermal and electrical resistances to very low values in the order of 0.015°C -inch 2/watt and $20 \times 10^{-6}$ ohm, respectively. As a typical example of the dimensions encountered in the pressure interface portion of our heatpipe cooled power semiconductor device assembly, the body of semiconductor material 11*a* has a thickness of 10 mils and a diameter of 2,000 mils for a 700 ampere, 1,200 volt rated semiconductor device, support plate 11*d* and 11*e* are each of approximately 40 mils thickness and pressure plates 10*a* and 12 are each of 100 to 300 mils thickness. Pressure plates 10*a* and 12 are fabricated of a metal having good electrically and thermally conductive characteristics such as copper as one example. The clamping means for pressure plates 10*a* and 12 consists of a plurality of metallic nut-bolt assemblies 13 provided with suitable electrically insulating washers 14 wherein each bolt passes aligned holes that have been formed in flange portions of pressure plates 10*a* and 12 as illustrated in FIG. 1, or through aligned holes in outer portions of planar pressure plates which have a greater diameter as illustrated in FIG. 2. The flange portions of the pressure plates in FIG. 1 which are adapted to receive the bolts 13 may be fabricated integral with the base portion as depicted by pressure plate 12 or may be fabricated separate from the base portion and then brazed, welded or otherwise joined thereto as depicted by pressure plate 10*a*. The metal bolts are provided with suitable electrically insulated jackets 13*a* to prevent short-circuiting across the pressure plates through the bolts. A pair of electrical power conductors 15 and 16 are suitably connected to pressure plates 10*a* and 12 by being soldered to terminals 10*a'* and 12' which are connected to the pressure plates or are formed as extending tab portions thereof as two examples.

Due to the small spacing between pressure plates 10 and 12 (90 mils for the above-described dimensions) and typical anode-to-cathode potentials of 1,200 volts applied across conductors 15 and 16, a means for increasing the creepage path between the pressure essure plates 10*a* and 12 which are at the voltages of conductors 15 and 16, respectively, is required to prevent arcover. A silicone rubber composition 17 such as the type RTV produced by the General Electric Company may be used to entirely fill the void between pressure plates 10*a* and 12 to thereby also provide a hermetic seal around power semiconductor device 11 and such rubber composition is run along the side surfaces of the pressure plates as indicated in FIG. 1 to obtain the increased creepage path between the pressure plates. Alternatively, and as illustrated in FIG. 2, a rubber or other electrically insulating material washer 17 having an outer diameter considerably greater than the diameter of the pressure plates is inserted in the gap between the pressure plates before they are clamped together. If the inner diameter of washer 17 is the same as the diameter of the semiconductor device, and the washer material is somewhat pliable, such washer may also provide the hermetic seal therefore. Alternatively, the inner diameter of electrically insulating washer 17 is greater than the diameter of the semiconductor device but less than the diameter of the pressure plates and a suitable O-ring seal 21 is provided around the semiconductor device between the pressure plates for obtaining the hermetic seal. The O-ring seal is preferably used with the washer 17 in FIG. 2 to assure a hermetic seal around the power semiconductor device since the washer alone might not provide the positive hermetic seal provided by the T-shaped insulation member 17 in FIG. 1. Our heat-pipe cooled power semiconductor device assembly may be mounted on a suitable bracket or other structure by means of one or more of the bottom portions of bolts 13 as one example. Finally, in the case wherein the power semiconductor device is of the three electrode type, the third electrode (generally described as the gate or control electrode) is provided with connection to a third electrical conductor 18 through a hole 19 formed in pressure plate 12 and aligned with the desired gate electrode, conductor 18 being suitably electrically insulated from pressure plate 12.

The heat pipe 10 is a sealed chamber or pipe which includes a vaporization or evaporator section that is placed in contact with the source of heat (the semiconductor device to be cooled) and a condensation section which is at the opposite end of the chamber and may be separated by distance therefrom up to several feet. A two-phase fluid coolant is contained within the heat pipe and effects heat transfer by vaporization of a liquid phase of the coolant resulting from heat conduction through pressure plate 10*a* from the power semiconductor device 11 to the evaporator section of the heat pipe. The vaporization section of the heat pipe thus receives heat from the device being cooled and the heated vapor, being under a relatively higher vapor pressure, moves to the lower pressure area in the condensation section of the heat pipe which functions as a surface condenser where the vapor condenses and the condensate returns to the evaporator section to be vaporized again and, thus, repeat the heat transfer cycle. The condensation section of the heat pipe has a relatively high thermal mass due to the large surface area thereof, and is provided with a finned heat exchanger to thereby function as an air-cooled surface condenser rejecting heat to ambient air which surrounds the condensation section. For more efficient removal of the heat to the ambient air, a fan or other means is utilized for obtaining forced air cooling by developing a sufficient air velocity of the ambient air passing by the cooling fins as depicted by the arrows in FIG. 1. In conventional heat pipes, a capillary pumping structure, or wick, is saturated with the liquid phase of the coolant and is used to pump the condensate to the evaporator section of the heat pipe by capillary action.

However, we have found that a wick is not essential to the operation of a heat pipe when it is of the gravity-feed type, that is, the heat pipe is oriented at some angle from the horizontal which need not be the extreme case of 90° indicated in FIGS. 2 and 3. Conventional heat pipes are generally designed to operate in a horizontal orientation and within some range of angles from the horizontal. Each of the heat pipes illustrated in each of the above-identified publications is shown in a horizontal orientation, and, as such, require the wick for pumping the condensed fluid from the condensation section to the evaporator section. In the gravity-feed heat pipe, the condensed fluid returns to the evaporator section by gravity. The omission of the wick material along the various inner surfaces of our heat pipe results in reduced thermal resistance since the wick adds another thermal resistance (loss) component into the system. Further, the use of a wicked heat pipe limits the effective length of the heat pipe that may be used since the pumping losses associated with the wick increase with heat pipe length. For these reasons, we employ the gravity-return heat pipe in both the embodiments illustrated in FIGS. 1 and 2, and as a result obtain more efficient cooling under both steady-state and transient heat conditions.

Since the evaporating section (boiling surface) of our heat pipe is relatively small compared to the large surface area in the condensing section, it is desirable to increase such boiling surface area and/or change the local fluid flow patterns in order to obtain a greater maximum heat rejection rate from pressure plate 10*a* (and therefore also from semiconductor device 11). Therefore, for purposes of enhancing (increasing) the vaporization rate in our heat pipe, a means is formed along the inner surface of pressure plate 10*a*, which forms one end of the heat pipe, for enhancing the boiling surface of the vaporization section of the heat pipe. This boiling surface enhancement means may be a porous metallic material 10*b* such as FOAMETAL, a product of the Hogen Industries, Willoughby, Ohio, which is nickel having a selected porosity in the range of about 60 to 95 percent that is sintered or otherwise joined to such inner surface of pressure plate 10*a*, or alternatively, may be small finned surace 30 thereon as illustrated in FIG. 3 for increasing such boiling surface area. Since the heat pipe 10 does not utilize conduction as the heat transfer process (except for transferring the heat into and out of the heat pipe walls), the heat transfer through the length of the heat pipe is a substantially isothermal process of evaporation and condensation whereby the condensation section of the heat pipe is at substantially the same temperature as the evaporation section. This heat transfer process is also known as vapor phase heat transfer. The most distinguishing feature of the heat pipe over the conventional air cooled finned or water cooled heat sink is its ability to transfer heat along its length with substantially no temperature change and thereby is much more efficient in its cooling ability than the conventional heat sink.

In FIG. 1, our gravity-feed heat pipe 10 is illustrated as being vertically oriented along its entire length (although as mentioned above, such orientation may be much less than 90° from the horizontal) and the sealed chamber of the heat pipe is defined by side wall 10*c*, pressure plate 10*a* as one end wall at the evaporating section and a suitable plug 10*d* at the condenser section end. The heat pipe may be circular, square or rectangular as typical examples of the cross section thereof. The side wall 10*c* is fabricated of a metal having a high thermal conductivity such as copper and has a thickness in the order of 40 mils. As a typical example, for a power semiconductor device having a steady-state electrical current rating of 700 amperes, the heat pipe 10 is 8 inches in length and 1.5 square inches in cross sectional area. Plug 10*d* may be fabricated of a compatible material such as copper and is suitably connected to the condenser section end of the heat pipe by brazing or any other well known metal joining process that assures a sealed chamber within the heat pipe. The side wall 10*c* of the heat pipe is also brazed or otherwise connected to provide the proper seal with pressure plate 10*a*. The side wall 10*c* may be provided with an electrically insulated collar 10*e* adjacent the evaporator section end of the heat pipe in order to insulate the finned condensation section of the heat pipe from the voltage applied through conductor 15 to pressure plate 10*a* and the adjacent lower-most portion of the side wall 10*c*, if such isolation is desired. Thus, side wall 10*c* is generally in two sections separated by the insulating collar 10*e*.

The finned heat exchanger along the outer surface of the condensation section of our heat pipe consists of large fins 10*f* which may be of the folded fin or plate fin types and are fabricated of a high thermal conductivity material such as copper. The fins 10*f* extend outward from the side walls 10*c* of the heat pipe a distance generally in the range of 0.5 to 1.0 of the dimension between the opposing side walls to which they are connected. For ease of fabrication, the heat pipe is often rectangular in cross section and the cooling fins are of length equal to the long dimension side of the heat pipe and are attached therealong.

The liquid state 10*g* of the two-phase fluid coolant is of small volume, merely sufficient to fully immerse the boiling surface enhancement means 10*b* on pressure plate 10*a* in the FIG. 1 embodiment. The coolant 10*g* may be water, or a freon refrigerant, as typical examples. In operation, the heat generated in power semiconductor device 11 is conducted to pressure plates 10*a* and 12 which have significant heat storage capabilities. Thus, in the case of heat transients, pressure plates 10*a* and 12 dampen the transient and thereby reduce the temperature rise in the semiconductor device below the peak value it would attain without the presence of the pressure plates. The heat is then conducted from the pressure plate 10*b* (and 12 if two-sided cooling is utilized) to the evaporator surface enhancement means 10*b* (or 30) at which point it vaporizes the liquid coolant 10*g*. The vapor coolant then moves to the condenser section of the heat pipe due to a differential vapor pressure and condenses into the liquid state which returns to the evaporator section under the force of gravity. The heat of condensation is absorbed by the heat pipe condensation section walls which due to the large surface area have a high thermal mass, and is conducted to the finned heat exchanger 10*f*, and finally to the ambient air which is flowing thereby at a relatively fast rate to obtain forced air cooling of the fins.

Referring now to FIG. 2, there is shown a double-sided heat-pipe cooled power semiconductor device assembly in accordance with our invention. In this two-sided cooled embodiment, the semiconductor device 11 and pressure plate assembly 10*a*, 12 are vertically oriented and the heat pipes each have a bend in their evaporation section end such that a major portion of each pipe is vertically oriented (although again they may be oriented at a lesser angle than 90° to the horizontal) and therefore is still of the gravity-feed type. Due to this configuration of the heat pipes, the liquid level of the two-phase fluid coolant 10*g* must be of sufficient depth in the evaporator section of the heat pipe to fully immerse the "heated" portion of the boiling surface enhancement means which again may be a porous metallic material 10*b* or short finned structure 30 on the heat-pipe end surfaces of the pressure plates. In the FIG. 2 embodiment, the second pressure plate 12 also functions as a means for conducting heat from the power semiconductor device 11 to the evaporator or boiling surface of the second heat pipe 20. In all respects, the heat pipe 20 may be identical to the heat pipe 10 in FIG. 2. Thus, electrically insulating collars 10*d* may be provided near the evaporator section end of each heat pipe as in the FIG. 1 embodiment.

In the case of the power semiconductor device 11 being of the three electrode type, the third conductor 18 may be brought out at the side of device 11 in order to provide a more convenient means of connection than by having to pass through one of the pressure plates and side wall of the heat pipe as would be necessary if the FIG. 1 approach was used.

It is apparent from the foregoing that our invention obtains the objectives set forth in that it provides a cooling system for power semiconductor devices which is significantly superior to the conventional finned heat sink system both as to its steady-state and transient response characteristics. The elimination of the wick in our gravity-feed heat pipe(s) removes one source of undesired thermal resistance and a possible limitation on total power handling capacity to thereby obtain a more efficient heat-pipe cooled power semiconductor device assembly. The heat-pipe interface with the power semiconductor device is obtained by a pressure plate in the case of single-sided cooling and two pressure plates in the case of double-sided cooling. The pressure interfaces developed between the pressure plates and the semiconductor device provide a good thermal and electrical conduction path therebetween. The location of the enhanced evaporating surface 10*b* or 30 in close proximity to the heat-emitting power semiconductor device (i.e., spaced by the thickness of the pressure plate) also decreases the steady-state thermal resistance as well as decreasing the transient temperature rise for long term heat overloads to thereby provide improved vaporization cooling of the power semiconductor device. This decreased steady-state thermal resistance results in the condenser section of our heat pipe being able to transfer heat to the ambient with greater efficiency than with conventional finned heat sinks or with the other heat-pipe cooled power semiconductor device assemblies enumerated above in the published art. The decreased steady-state thermal resistance is due also to the fact that the pressure plate is of relatively thin dimension compared to the conventional copper heat sinks of much thicker dimension previously utilized. The decreased transient temperature rise is also obtained by the fact that the walls of the heat pipe and the fluid coolant can store the heat upon the two-phase fluid evaporating in the evaporator section of the heat pipe and therefore the heat pipe walls and fluid also provide a damping of temperature rises which are of the transient type. Also, the nut-bolt assembly for clamping the pressure plates together results in a very convenient means for removing the power semiconductor device and thus this replaceable feature is also an important aspect of our invention. The porous metal evaporating surface enhancement structure or layer **10*b* is of uniform thickness in a range of 10 to 50 mils. Finally, the electrically insulating collar(s) 10*e* permits the forced air-cooled portion of our assembly to be outside a cabinet in which the semiconductor device 11 and pressure plates may be mounted, and such finned portion 10*f* would thus be electrically isolated from the high voltage applied to the semiconductor body. Also, these electrically insulating collars permit the cooling fins 10*f*** to be exposed to dirty air without the possibility of increased surface conduction along the creepage path around the semiconductor body that occurs with conventional finned heat sinks or heat pipes not having such collars and operating in dirty air.

Having described a single-sided and double-sided heat-pipe cooled power semiconductor device assembly, it is believed obvious that modification and variation of such specific embodiments may readily be made by one skilled in the art. It is, therefore, to be understood that changes may be made in the gravity-feed heat-pipe power semiconductor device assembly which are within the full intended scope of our invention as defined by the following claims.

What we claim as new and desire to secure by Letters Patent of the United States is:

1. A heat-pipe cooled power semiconductor device assembly comprising a power semiconductor device including a body of semiconductor material defined by first and second flat parallel major surfaces, and first and second support plates having first major surfaces forming interfaces with the first and second flat parallel surfaces of the body of semiconductor material, said support plates fabricated of an electrically conductive high strength material having a coefficient of thermal expansion substantially equal to that of the semiconductor material, said first support plate bonded to said body of semiconductor material along the first surface thereof, said second support plate not being bonded to said body of semiconductor material but merely in pressure contact therewith to prevent damage to the body of semiconductor material due to stresses that would be induced by the thermal expansions of both support plates and body of semiconductor material when the semi-conductor device is operating under normal conditions if both support plates and body of semiconductor material were bonded together to form an integral body, said power semiconductor device defined as developing a thermal density of at least 100 watts per square inch of surface area, first and second relatively thin pressure plates fabricated of a thermally conductive material and having first major surfaces respectively in pressure contact with second major surfaces of said first and second support plates, said pressure plates are each of thickness in the range of 100 to 300 mils, means for clamping said first and second pressure plates together to obtain a pressure in the order of 2,000 lbs. per square inch against said semiconductor device and for providing easy removal of said power semiconductor device from the assembly, means for connecting a pair of electrical conductors to said pressure plates for supplying electrical power to said power semiconductor device, a first long nonwicked gravity-return heat pipe having an open evaporator section end enclosed by and connected to a second major surface of said first pressure plate which functions as an evaporating surface of the first heat pipe in close proximity to the heat-emitting power semiconductor device for decreasing the steady-state thermal resistance as well as decreasing transient temperature rise for long term heat overloads to obtain improved vaporization cooling of the device superior to that obtained with conventional finned heat sinks or with wicked heat pipes, a second long nonwicked gravity-return heat pipe having an open evaporator section end enclosed by and connected to a second major surface of said second pressure plate which functions as an evaporating surface of the second heat pipe in close proximity to the semiconductor device to obtain improved double-sided vaporization cooling of the device, means connected only along the second major surfaces of said pressure plates for enhancing the evaporation surfaces thereof and thereby increasing the rate of heat transfer from the pressure plates to a liquid coolant in the heat pipes which is vaporized, said first and second nonwicked gravity-return heat pipes each comprise an enclosed elongated hollow chamber having an evaporator section at a first end thereof defined by said pressure plates and a condenser section at a second end thereof remote from the first end, a two-phase fluid coolant contained within each said chamber, the liquid state of the fluid coolant having sufficient volume to cause immersion of at least the heated portion of the evaporation surface enhancing means in the liquid coolant, and at least a substantial portion of each of said first and second heat pipes being oriented at an angle greater than 0° with respect to the horizontal.

2. The heat-pipe cooled power semiconductor device assembly set forth in claim 1 and further comprising means in contact with said first and second pressure plates for providing a hermetic seal around said body of said semiconductor material.

3. The heat-pipe cooled power semiconductor device assembly set forth in claim 1 wherein at least a substantial portion of said heat pipes is oriented at an angle greater than 0° with respect to the horizontal.

4. The heat-pipe cooled power semiconductor device assembly set forth in claim 2 and further comprising a third electrical conductor connected to one of said first and second surfaces of said body of semiconductor material.

5. The heat-pipe cooled power semiconductor device assembly set forth in claim 2 wherein a condenser section of said chamber is provided with cooling fins along the outer surface thereof for increasing the rate of each heat transfer to ambient air surrounding said assembly.

6. The heat-pipe cooled power semiconductor device assembly set forth in claim 1 wherein said clamping means comprises at least two nut-bolt assemblies for bolting said first and second pressure plates together.

7. The heat-pipe cooled power semiconductor device assembly set forth in claim 1 wherein said evaporation surface enhancing means is a porous metallic structure which is sintered to the second major surface of said pressure plates.

8. The heat-pipe cooled power semiconductor device assembly set forth in claim 7 wherein said porous metallic structure is of uniform thickness in the range of 10 to 50 mils, and the metal thereof is nickel.

9. The heat-pipe cooled power semiconductor device assembly set forth in claim 1 wherein said evaporation surface enhancing means is an irregular surface formed on the second major surface of said pressure plates for increasing the surface area thereof.

10. The heat-pipe cooled power semiconductor device assembly set forth in claim 9 wherein said irregular surface consists of small fins formed of a heat conductive material on the second major surface of said pressure plates.

11. The heat-pipe cooled power semiconductor device assembly set forth in claim 1 and further comprising electrically insulating means connected between said first and second pressure plates and disposed completely around the nonmajor surface of said power semiconductor device for increasing the creepage path thereacross.

12. The heat-pipe cooled power semiconductor device assembly set forth in claim 5 and further comprising an electrically insulating collar connected between the condenser section and evaporating section of each of said nonwicked gravity-return heat pipes for electrically isolating the finned portion of the heat pipe from the power semiconductor device.

* * * * *